United States Patent
Azegami (10) Patent No.: US 6,323,678 B1
(45) Date of Patent: *Nov. 27, 2001

(54) INTEGRATED CIRCUIT DEVICE WITH PROGRAMMABLE JUNCTIONS AND METHOD OF DESIGNING SUCH INTEGRATED CIRCUIT DEVICE

(75) Inventor: Kengo Azegami, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/909,085

(22) Filed: Aug. 14, 1997

(30) Foreign Application Priority Data

Jan. 9, 1997 (JP) ..................................... 9-002379

(51) Int. Cl.[7] .................................................. H03K 19/177
(52) U.S. Cl. .................................. 326/39; 326/38; 326/41; 326/47
(58) Field of Search .................................. 326/38–39, 41, 326/47; 395/500.17, 500.18

(56) References Cited

U.S. PATENT DOCUMENTS

| | | | |
|---|---|---|---|
| 5,204,556 | * 4/1993 | Shankar | 326/39 |
| 5,327,023 | * 7/1994 | Kawana et al. | 326/39 |
| 5,381,058 | * 1/1995 | Britton et al. | 326/47 |
| 5,436,576 | * 7/1995 | Hibdon et al. | 326/47 |
| 5,504,440 | * 4/1996 | Sasaki | 326/17 |
| 5,691,653 | * 11/1997 | Mendel | 326/39 |
| 5,880,598 | * 3/1999 | Duong | 326/39 |

\* cited by examiner

*Primary Examiner*—Michael Tokar
*Assistant Examiner*—Steven S. Paik
(74) *Attorney, Agent, or Firm*—Armstrong, Westerman, Hattori, McLeland & Naughton, LLP.

(57) ABSTRACT

According to the present invention, there is also provided a field gate array comprising a matrix of logic cells each having n input terminals, a plurality of intercell buses disposed between the logic cells and each having a plurality of intercell signal lines, and programmable junctions disposed around the logic cells and each including the intercell signal lines, n input terminal lines intersecting with the intercell signal lines and connected to the input terminals, and programmable switches disposed at intersections between the intercell signal lines and the input terminal lines, the switches being placed at positions for connecting n of the first signal lines to at least one combination of the n input terminal lines and for connecting optional m (m<n) of the intercell signal lines simultaneously to any of the input terminal lines. With the above arrangement, the junction comprises a minimum number of switches and hence has as small an area as possible.

9 Claims, 11 Drawing Sheets

INTEGRATED CIRCUIT DEVICE WITH PROGRAMMABLE JUNCTIONS AND METHOD OF DESIGNING SUCH INTEGRATED CIRCUIT DEVICE

BACKGROUND OF THE INVENTION

The present invention relates to an integrated circuit device having programmable junctions, and more particularly to a structure of and a method of designing programmable junctions of a field programmable gate array (FPGA) or a multimicroprocessor system.

FPGAs comprise a matrix of logic cells capable of performing various logic operations and a plurality of intercell signal lines disposed between the logic cells. The intercell signal lines are connectable to input/output terminals of the logic cells to connect the logic cells in an optional combination for thereby achieving a desired logic circuit. Therefore, junctions between the intercell signal lines and the input/output terminals of the logic cells have a programmable structure, i.e., comprise a set or cluster of program switches.

One simple approach to connecting the logic cells with greater flexibility is to provide as many program switches as possible. Consequently, conventional FPGAs have program switches so positioned at the junctions as to be able to connect all commutable input terminals of the logic cells freely to intercell signal lines. Alternatively, those program switches are positioned to substantially perform such a function.

An FPGA chip has an area of a matrix of logic cells, an area of intercell buses comprising a plurality of intercell signal lines, junctions comprising a plurality of program switches, and a switch block connecting horizontal and vertical intercell signal lines. The density of an FPGA logic circuit is substantially inversely proportional to the total number of program switches at the junctions and the area of each of the program switches for the reason that most of the area of the FPGA chip is occupied by the junctions having the program switches.

In order to increase the number of logic gates that can be realized per unit area so as to increase an area efficiency, it is necessary to reduce the total number of program switches thereby to reduce the area of the junctions.

However, since the program switches of the conventional FPGAs are so positioned as to be able to connect all the commutable input terminals of the logic cells freely to the intercell signal lines, the area efficiency of the resultant logic circuit tends to be low. This problem holds true for the junctions of a multimicroprocessor system in which microprocessors are connectable in an optional combination.

SUMMARY OF THE INVENTION

It is therefore an object of the present invention to provide an integrated circuit device which has programmable junctions with program switches optimized in number and placement for increasing an area efficiency without lowering a connection efficiency.

Another object of the present invention is to provide an integrated circuit device which has programmable junctions with program switches optimized in number and placement for increasing an area efficiency without lowering a connection efficiency and also for increasing a circuit speed.

Still another object of the present invention is to provide a method of designing an integrated circuit device which has junctions with a process of arranging program switches at the junctions for increasing an area efficiency without lowering a connection efficiency.

According to the present invention, there is provided an integrated circuit device comprising a plurality of first signal lines, n second signal lines intersecting with the first signal lines, and a junction having programmable switches positioned at intersections between the first signal lines and the second signal lines, the switches being placed at positions for connecting n of the first signal lines to at least one combination of the n second signal lines and for connecting optional m (m<n) of the first signal lines simultaneously to any of the second signal lines.

According to the present invention, there is also provided a field gate array comprising a matrix of logic cells each having n input terminals, a plurality of intercell buses disposed between the logic cells and each having a plurality of intercell signal lines, and junctions disposed around the logic cells and each including the intercell signal lines, n input terminal lines intersecting with the intercell signal lines and connected to the input terminals, and programmable switches disposed at intersections between the intercell signal lines and the input terminal lines, the switches being placed at positions for connecting n of the first signal lines to at least one combination of the n input terminal lines and for connecting optional m (m<n) of the intercell signal lines simultaneously to any of the input terminal lines.

With the above arrangement, the junction comprises a minimum number of switches and hence has as small an area as possible.

Maximum and minimum numbers of the switches connected to the intercell signal lines differ from each other by at most 1. Alternatively, maximum and minimum numbers of the switches connected to the input terminal lines differ from each other by at most 1. Loads on the switches connected to the intercell signal lines or the input terminal lines are thus uniformized for thereby increasing the operating speed of the field programmable gate array.

According to the present invention, there is further provided a method of designing an integrated circuit device having a plurality of first signal lines, n second signal lines intersecting with the first signal lines, and a junction having programmable switches positioned at intersections between the first signal lines and the second signal lines, the comprising the steps of placing the switches in a first region of the junction at intersections between n of the first signal lines and the n second signal lines, such that the number of switches connected to each of the first signal lines is 1 and the number of switches connected to each of the second signal lines is 1, placing m (m<n) of the switches on the first signal lines in a second region of the junction outside of the first region, moving switches placed on the first signal lines along the first signal lines for uniformizing the numbers of switches connected to the second signal lines in the second region, and moving switches placed on the second signal lines in the second region along the second signal lines for uniformizing the numbers of switches connected to the first signal lines in the second region and the first region.

According to the present invention, there is also provided a method of designing a field programmable gate array, having a matrix of logic cells each having n input terminals, a plurality of intercell buses disposed between the logic cells and each having a plurality of intercell signal lines, and junctions disposed around the logic cells and each including the intercell signal lines, n input terminal lines intersecting with the intercell signal lines and connected to the input terminals, and programmable switches disposed at intersections between the intercell signal lines and the input terminal lines, the method comprising the steps of placing the switches in a first region of the junction at intersections between n of the intercell signal lines and the n input terminal lines, such that the number of switches connected to each of the intercell signal lines is 1 and the number of switches connected to each of the input terminal lines is 1, placing m (m<n) of the switches on the intercell signal lines in a second region of the junction outside of the first region, moving switches placed on the intercell signal lines along the intercell signal lines for uniformizing the numbers of switches connected to the input terminal lines in the second region, and moving switches placed on the input terminal lines in the second region along the input terminal lines for uniformizing the numbers of switches connected to the intercell signal lines in the second region and the first region.

According to the above methods, it is possible to place a minimum number of switches at optimum positions.

The principles of the present invention are applicable to not only a field programmable gate array, but also any of various other integrated circuit devices such as a multimicroprocessor system having a plurality of microprocessors each having a plurality of input terminals connected to a plurality of signal lines at respective intersections where program switches are placed.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

The present invention will be described below as being applied to an FPGA. However, the principles of the present invention are not limited to the FPGA, but may be incorporated in an integrated circuit device having junctions with program switches, such as a multimicroprocessor system, for example.

Figure 1:
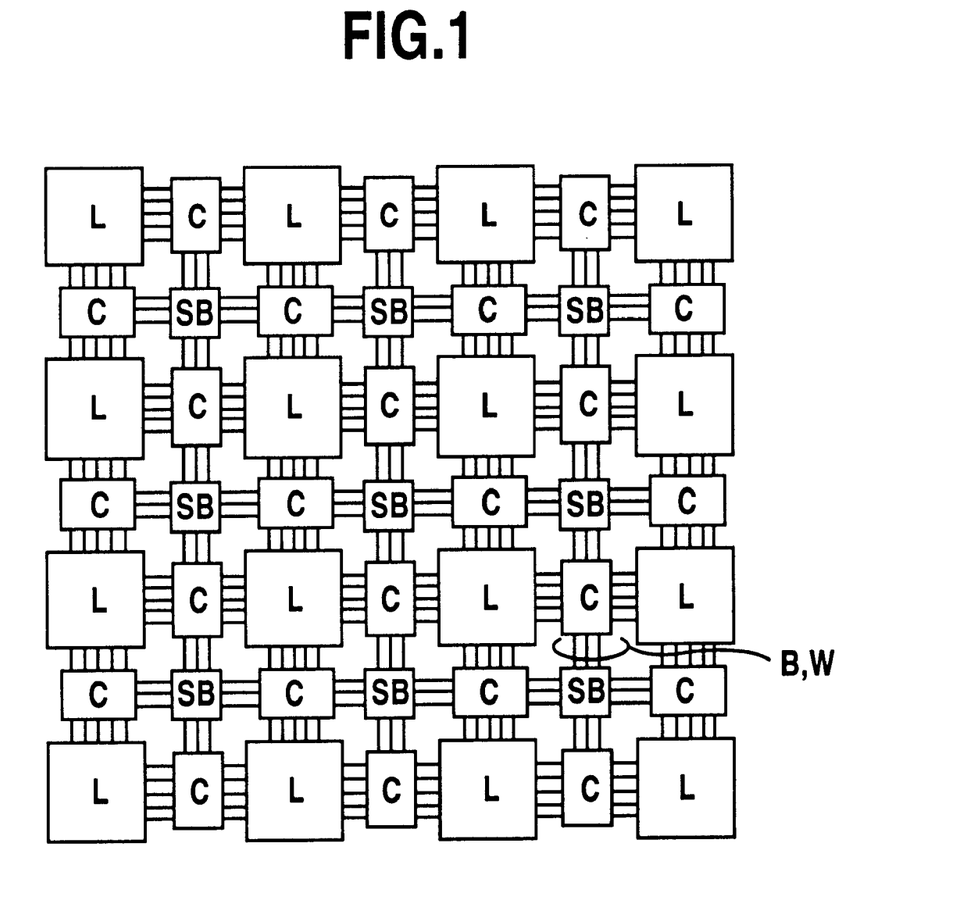
FIG. 1 is a block diagram of a general FPGA.

FIG. 1 shows a general FPGA in block form. As shown in FIG. 1, the FPGA comprises a matrix of logic cells L mounted on a chip and each having logic circuit blocks for performing various logic operations, and a plurality of intercell buses B disposed between the logic cells L and having a plurality of horizontal and vertical intercell signal lines W. The intercell signal lines W are connected to input/output terminals extending from the logic cells L by program switches at junctions C. The program switches comprise components such as pass transistors, fuses, or the like whose conducted state can be controlled according to a program. The switches of this type are referred to as passive circuits. Alternatively, the program switches may comprise active circuits such as AND gates which can transfer a signal depending on a status signal applied to a program terminal.

The FPGA also has a plurality of switching blocks SB for connecting the vertical logic cell buses B and the horizontal logic cell buses B in an optional combination. Therefore, the switching blocks SB are also programmable.

Figure 2:
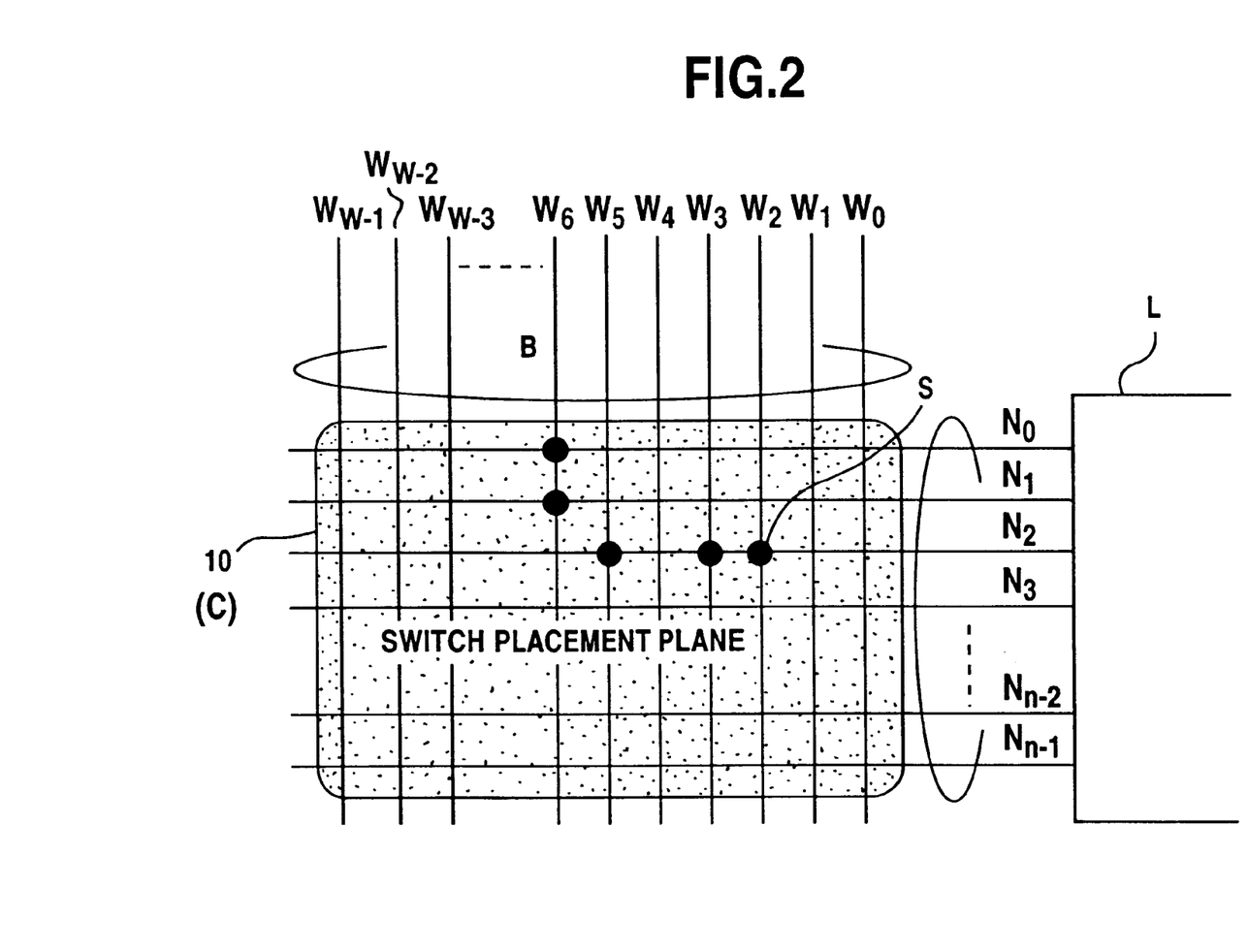
FIG. 2 is a circuit diagram showing an example of a junction of the FPGA.

The present invention resides in the number and placement of program switches at the junctions C which can connect relatively freely input terminals extending from the logic cells L and the intercell signal lines W. FIG. 2 shows an example of such a junction C. As shown in FIG. 2, n input terminals $N_0 \sim N_{n-1}$ extend horizontally through the junction C from a logic cell L. In FIG. 2, $N_0 \sim N_{n-1}$ actually represent input terminal tips extending from input terminals, but will hereinafter be used to refer to input terminals for illustrative purpose. An intercell bus B extends vertically through the junction C. The intercell bus B comprises w (w>n) intercell signal lines $W_0 \sim W_{n-1}$. An optimum number of programmable switches S disposed in an optimum placement are positioned respectively at certain intersections between intercell signal lines W and input terminals N. The programmable switches S are disposed in a planar area or switch placement plane 10 which serves as the junction C.

In the example shown in FIG. 2, all the input terminals N are commutable. However, not all the input terminals N do not need to be commutable. For example, some of the input terminals N may be commutable. The reference characters W, N, S used herein denote the set of the intercell signal lines, the input terminals, and the program switches respectively.

The inventor has studied integrated circuit devices, including FPGAs, having program switches at programmable junctions, and found that it is statistically rare for all commutable input terminals of logic cells and microprocessors to be used simultaneously and connected to different intercell signal lines. The principles of the present invention are based on the concept that not all commutable input terminals of logic cells or the like may be simultaneously connected to different intercell signal lines.

A junction according to an embodiment of the present invention is arranged to satisfy the following conditions: A junction between an intercell bus having w intercell signal lines W and a logic cell having n (w>n) commutable input terminals N should satisfy:

(1) a condition 1 that n of the w intercell signal lines of the intercell bus can be connected to the n input terminals of the logic cell by a minimum number of program switches;

(2) a condition 2 that optional m (m<n) of the w intercell signal lines can be simultaneously connected to any of the n input terminals by a minimum number of program switches; and (3) a condition 3 that the difference between the number of program switches connected to the intercell signal lines and the number of program switches connected to the input terminals is minimum.

The condition 1 means that n of the w intercell signal lines are connected to the n input terminals in at least one combination. Stated otherwise, the condition 1 indicates that all the n input terminals become available by being necessarily connected to any of the intercell signal lines W. Therefore, the condition 1 is a minimum requisite to be fulfilled when a logic cell having n input terminals is used.

The condition 2 means that all m intercell signal lines, fewer than n intercell signal lines, can be simultaneously connected to any of the n input terminals. Specifically, the m intercell signal lines are simultaneously connected to m input terminals in any combination. While a junction which allows optional n of the w intercell signal lines to be connected to any of the n input terminals has the greatest freedom, since the probability that all the n intercell signal lines will be connected to different intercell signal lines is actually very small, the condition 2 stipulates that m intercell signal lines, fewer than n intercell signal lines, can be simultaneously connected to any m of the n input terminals for increasing the area efficiency. Since the input terminals are commutable, optionally selected m of the w intercell signal lines may be connected to any of the input terminals. With the condition 1 added, combinations in which all n input terminals are connected to intercell signal lines are made possible. Therefore, it is possible to connect m input terminals simultaneously to different m intercell signal lines according to a lemma, described later on, under the condition 2.

The condition 3 is a placement condition to reduce a signal skew for thereby probabilistically increasing the speed of the overall logic circuit. Specifically, if the number of program switches connected to one intercell signal line increases, then the load resistance of that intercell signal line increases. Similarly, if the number of program switches connected to one input terminal increases, the load resistance of that input terminal increases. Therefore, the numbers of program switches connected to input terminals are uniformized as much as possible to reduce the worst load resistance and the signal skew for thereby increasing the operating speed of the overall logic circuit.

A process of placing program switches which meet the above three conditions at grid points of intercell signal lines W and input terminals N in the switch placement plane 10 within the junction will be described below. First, several definitions will be given below.

Definition 1: Commutable Input Pair

It is assumed that a certain logic circuit realizes a function $f(---, x_i, ---, x_j, ---)$, and that $a_i$, $a_j$ are elements of a set $\{01\}$ comprising 0, 1. If in a factor $f(---, a_i, ---_j, ---) = f(---, a_j, ---, a_i, ---)$ then an input terminal pair of the logic circuit which corresponds to an argument pair $\{x_i\ x_j\}$ is referred to as a commutable input pair.

According to a lemma 1 derived from the definition 1, based on a feature of a commutable input pair, when a logic circuit has input terminals a, b, c, if the input terminals a, b constitute a commutable input pair and the input terminals b, c constitute a commutable input pair, then the input terminals a, c also constitute a commutable input pair. This lemma is so obvious that no showing of supporting reasons will be necessary.

Definition 2: Commutable Input Group

It is assumed that a set X is an argument set of a logic function f and $X_0$ indicates a subset of the set X. If two optional elements $x_i$, $x_j$ of the subset $X_0$ are a commutable input pair, then an input terminal group of a logic circuit which corresponds to an argument group $X_0$ is referred to as a commutable input group.

Furthermore, as shown in FIG. 2, it is assumed that when intercell signal lines W of an intercell bus are represented by $\{W_0\ W_1\ ---\ ;\ W_{w-1}\}$ and input terminals N by $\{N_0\ N_1\ ---\ N_{n-1}\}$, a program switch located at the intersection between an intercell signal line $W_6$ and an input terminal $N_3$ is indicated by $S_{36}$. Under this assumption, the following definitions are further given.

Definition 3: a function for returning a set of program switches connected to a set of input terminals of a logic cell given to an argument is indicated by $S_H$. For example, $$S_H(\{N_2\}) = \{S_{25} S_{23} S_{22}\}$$

Definition 4: a function for returning a set of program switches connected to a set of intercell signal lines given to an argument is indicated by $S_v$. For example, $$S_v(\{W_2\}) = \{S_{25} S_{23} S_{22}\}$$

Definition 5: a function for returning a set of intercell signal lines connected to a set of program switches given to an argument is indicated by $W_v$. For example, $$W_v(\{S_{16}\}) = \{W_6\}$$

Definition 6: a function for returning a set of input terminals of a logic circuit connected to a set of program switches given to an argument is indicated by $W_H$. For example, $$W_H(\{S_{16}\}) = \{N_1\}$$

Processes of Placing Program Switches

A process of placing program switches which satisfy the condition 1 will first be described below. The condition 1 states that n of w intercell signal lines of an intercell bus can be connected to n input terminals of a logic cell by a minimum number of program switches. That is, the condition 1 means that n of the w intercell signal lines are connected to the n input terminals in at least one combination.

To meet the condition 1, given a subset $W_0$ of intercell signal lines W, which has n elements, optional intercell signal lines of the subset $W_0$ may be connected to at most one input terminal, and all the intercell signal lines of the subset $W_0$ may be connected to different input terminals. Stated otherwise, at most one program switch is connected to optional intercell signal lines $W_i$ of the intercell signal lines which are the elements of the subset $W_0$ ($\forall W_i \in W_0$), and at most one program switch is connected to optional input terminals $N_i$ ($\forall N_i \in N$). This is a lemma of the condition 1.

Figure 3:
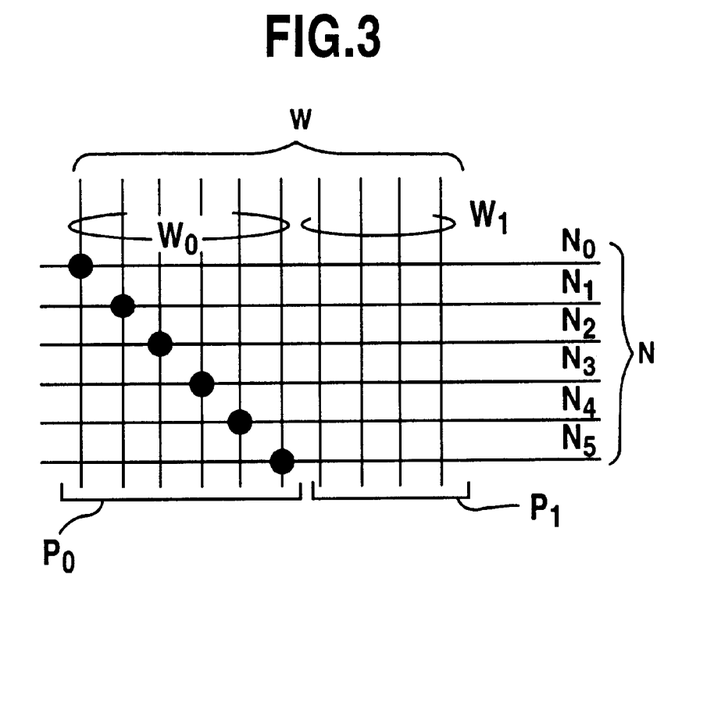
FIG. 3 is a diagram showing an example of program switches placed in a placement plane where w=10, n=6.

A specific example of the condition of the above lemma is shown in FIG. 3, which illustrates an example of program switches placed in a placement plane where w=10, n=6. As shown in FIG. 3, program switches are placed in an oblique array at intersections between intercell signal lines of a subset $W_0$ of 10 intercell signal lines W and 6 input terminals N. The oblique array is not of particular importance. As described above, the condition is that, with a least number of program switches, an intercell signal line which is an element of the subset $W_0$ should have one program switch, and n input terminals $N_0$~$N_5$ which are the elements of the input terminals N should have one program switch. One typical example of the condition is indicated by the oblique array of program switches shown in FIG. 3.

It is assumed that a plane to which the subset $W_0$ shown in FIG. 3 belongs is referred to as a plane $P_0$, and the remaining plane as a plane $P_1$, and that a subset of intercell signal lines in the plane $P_1$ is referred to as $W_1$.

A process of placing program switches which satisfy the condition 2 will be described below. The condition 2 states that optional m (m<n) of w intercell signal lines can be simultaneously connected to any of n input terminals by a minimum number of program switches. That is, the condition 2 means that all m intercell signal lines, fewer than n intercell signal lines, can be simultaneously connected to any m of the n input terminals.

It is apparent that the condition 2 is premised that program switches satisfying the condition 1 have been placed. Therefore, it is assumed that an oblique array of program switches satisfying the condition 1 is placed in the plane $P_0$ shown in FIG. 3. According to the condition 2, it is necessary that optional m of the w intercell signal lines of the set W be able to be simultaneously connected to different m input terminals. Consequently, it is necessary for at least m program switches to be connected to optional ones of the intercell signal lines which are the elements of the subset $W_1$ ($\forall W_j \in W_1$). This is a lemma of the condition 2.

The above lemma of the condition 2 will be proven as follows: According to the condition 1, n intercell signal lines of the subset $W_0$ can be connected to input terminals. Therefore, m intercell signal lines that are fewer than n intercell signal lines can of necessity be connected to different input terminals. It is assumed that $m_0$ intercell signal lines of the subset $W_0$ and $m_1$ intercell signal lines of the subset $W_1$ ($m_0+m_1=m$) are simultaneously connected to input terminals.

The case (1) where $m_1=0$ and $m_0=m$ is included in the lemma of the condition 1. Specifically, as shown in FIG. 3, optional m intercell signal lines in the plane $P_0$ can be simultaneously connected to input terminals.

In the case (2) where $n>m_1>0$ and $n>m_0>0$, since the connected stated of $S_v(W_0)$ is not related to the connected stated of $S_v(W_0)$, it is necessary that at least m program switches be connected to each of the intercell signal lines of the subset $W_1$. Specifically, even if some input terminals to which program switches $S_v(W_1)$ are connected are connected to any of the intercell signal lines of the subset $W_0$ in a worst case depending on the connected stated of $S_v(W_0)$, since m program switches are placed in the subset $W_1$, $m_1$ intercell signal lines can be simultaneously connected to input terminals.

Furthermore, the case (3) where $m_1=m$ and $m_0=0$ is included in the case (2) above. Specifically, intercell signal lines can be connected to different m input terminals using m program switches in the subset $W_1$. Input terminals free of program switches in the plane $P_1$ can be connected to intercell signal lines by input terminals which have program switches commutable therewith.

A review of the above three cases indicates that the lemma of the condition 2 is true. In order to minimize the number of program switches under the above lemma, the number of $S_v(W_1)$ should be set to m.

Figure 4:
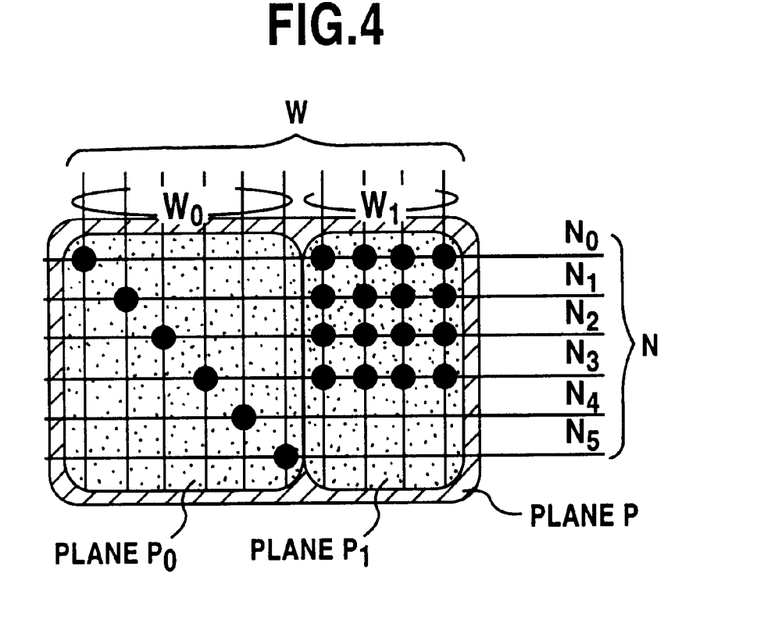
FIG. 4 is a diagram showing an example of program switches placed in the placement plane where w=10, n=6, with m=4.

FIG. 4 shows an example of program switches placed in the placement plane where w=10, n=6 as shown in FIG. 3, with m=4. In the example shown in FIG. 4, program switches are placed at intersections between m input terminals $N_0$~$N_3$ and intercell signal lines $W_1$ in the plane $P_1$. The example of program switches shown in FIG. 4 is an example which simultaneously satisfies the conditions 1 and 2 with a minimum number of program switches.

According to a feature of the present invention, no program switches are placed at intersections between the input terminals $N_4$, $N_5$ and intercell signal lines in the plane $P_1$. Specifically, because it is rare for all n input terminals of the commutable input terminals $N_0$~$N_5$ to be connected to different intercell signal lines, program switches are connected to only m intercell signal lines. No program switches are placed at the above intersections as a result of placing a minimum number of program switches in a manner to meet the condition 2.

A process of moving the positions of the program switches in the example shown in FIG. 4 in order to satisfy the condition 3 will be described below. The condition 3 states that the difference between the number of program switches connected to intercell signal lines and the number of program switches connected to input terminals is minimum. As described above, the condition 3 serves to minimize variations of the numbers of program switches connected to intercell signal lines and input terminals to reduce the signal skew for thereby minimizing the number of loads in a worst case and increasing the speed of the overall logic circuit. Normally, the speed of a logic circuit is governed by the speed in a worst case.

Therefore, a lemma to be met for satisfying the condition 3 is:

|the number of $S_v(\{W_i\})$–the number of $S_v(\{W_j\})|\leq 1$, and

|the number of $S_H(\{W_k\})$–the number of $S_H(\{W_1\})|\leq 1$.

Specifically, the numbers of program switches connected to optional intercell signal lines differ by at most one, and the numbers of program switches connected to optional input terminals differ by at most one. Movement procedures for moving 22 program switches shown in FIG. 4 within a range that does not violate the conditions 1, 2 or their lemmas for thereby satisfying the above lemmas will be described below.

A first movement procedure is a movement procedure for program switches in the partial plane $P_1$. A lemma for carrying out this movement procedure within a range that does not violate the condition 2 or its lemma is that vertical movement of program switches along the intercell signal lines in the partial plane $P_1$ does not violate the condition. The reason for this is very simple. Since the lemma of the condition 2 is to set the number of program switches $S_v(W_1)$ to m, vertical movement of program switches along the intercell signal lines does not violate the lemma. Stated otherwise, such vertical movement of program switches does not change the number of program switches connected to the intercell signal lines. Since the input terminals are commutable, a program switch does not violate the condition 2 on matter where it may be positioned insofar as it is positioned on the same intercell signal line.

Figure 5A:
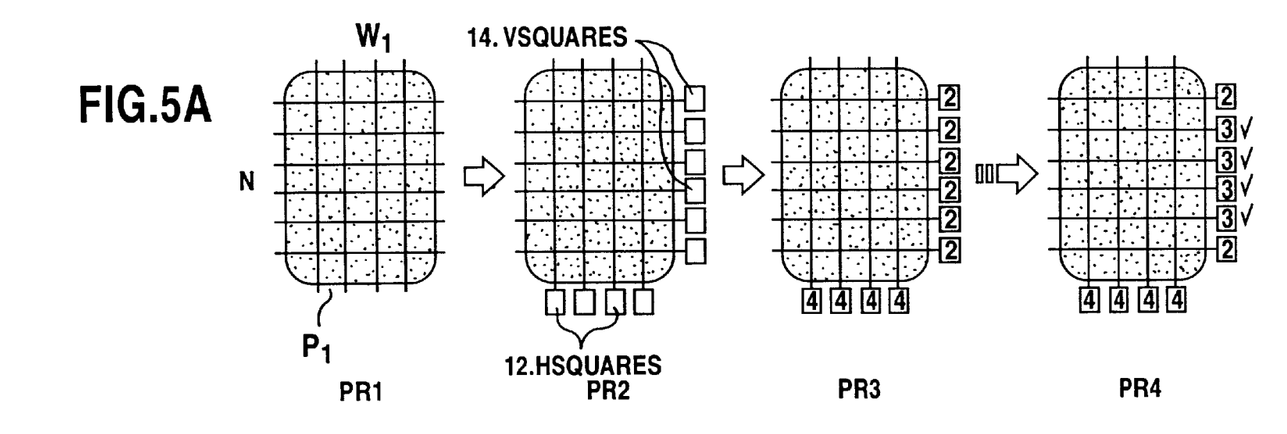
FIG. 5 is a diagram illustrative of movement procedures for 16 program switches in a partial plane $P_1$.
Figure 5B:
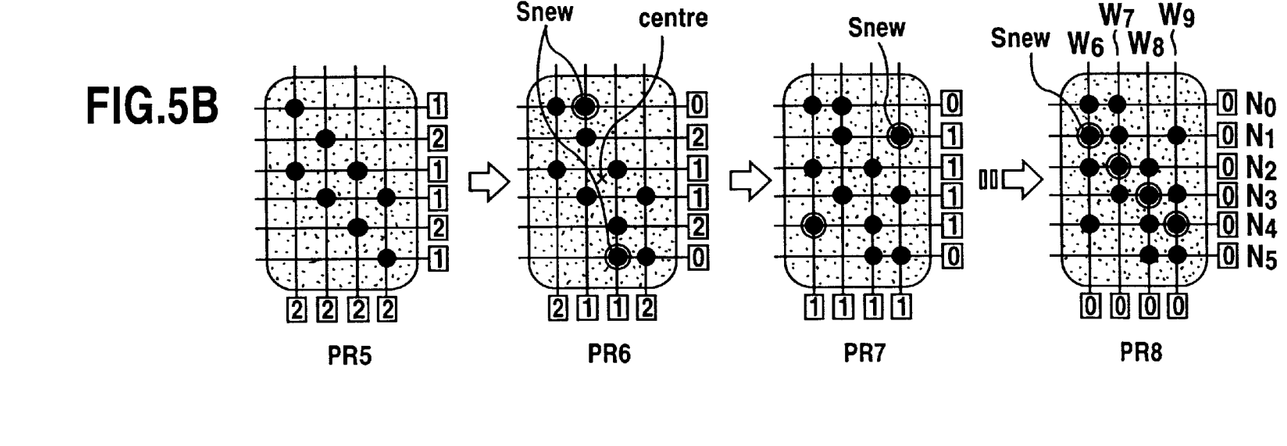

FIG. 5 illustrates movement procedures for 16 program switches in the partial plane $P_1$. The 16 program switches are placed in the partial plane $P_1$ according to procedures PR1~PR8.

As indicated by the procedure PR1, the partial plane $P_1$ is first prepared. One example of the partial plane $P_1$ comprises four intercell signal lines $W_1$ and six input terminals N as shown in FIGS. 3 and 4. Then, according to the procedure PR2, squares 12, 14 for marking target numbers of program switches are prepared at ends of the intercell signal lines $W_1$ and the input terminals N. The squares 12 are each marked with a numerical value produced by dividing the number of elements (=16) of a set $S_1$ of program switches in the plane $P_1$ by the number of elements (=4) of the set of intercell signal lines $W_1$, with fractions being ignored (=16/4=4). The produced numerical value is shown in the procedure PR3. The squares 14 are similarly each marked with a numerical value produced by dividing the number of elements (=16) of the set $S_1$ of program switches in the plane $P_1$ by the number of elements (=6) of the set of input terminals N, with fractions being ignored (=16/6=2 (remainder=4)). The produced numerical value is also shown in the procedure PR3. If there is a remainder, then a numerical value 1 is added to each of as many squares 14 as the numerical value of the remainder (=4), as shown in the procedure PR4. As a result, the numerical values marked in the squares 12, 14 represent the maximum numbers of program switches connected to the intercell signal lines and the input terminals. It should be noted that these numerical values differ from each other by at most 1.

Then, according to the procedure PR5, program switches are placed obliquely from upper left and lower right in the plane. In this example, four program switches are placed in each of two oblique arrays. The number of placed program switches is subtracted from the numerical values marked in the squares 12, 14. Then, according to the procedure PR6, a new program switch $S_{new}$ marked with double circles is placed at an intercell signal line or an input terminal which is associated with the fewest program switch. Simultaneously, another program switch $S_{new}$ is placed at a position in symmetric relation to the new program switch $S_{new}$ with respect to the center of the plane $P_1$. The number of these added program switches is subtracted from the numerical values marked in the associated squares 12, 14.

The same process is repeated to add two program switches $S_{new}$ according to the procedure PR7 and four program switches $S_{new}$ according to the procedure PR8 until the numerical values marked in all the squares 12, 14 become nil. The placement of 16 program switches S according to the procedure PR8 satisfies the condition 3. In FIG. 4, four intercell signal lines can be simultaneously connected to input terminals $N_0$~$N_3$. Since the input terminals $N_0$~$N_5$ are commutable, the condition 2 is not violated even if the input terminals $N_0$, $N_1$, $N_2$, $N_4$ can be simultaneously connected to the intercell signal line $W_6$, the input terminals $N_0$, $N_1$, $N_2$, $N_3$ can be simultaneously connected to the intercell signal line $W_7$, the input terminals $N_2$, $N_3$, $N_4$, $N_5$ can be simultaneously connected to the intercell signal line $W_8$, and the input terminals $N_1$, $N_3$, $N_4$, $N_5$ can be simultaneously connected to the intercell signal line $W_9$, according to the procedure PR8 in FIG. 5. Thus, this state satisfies the condition 2.

The procedures for satisfying the condition 3 may be such that the program switches in the plane $P_1$ shown in FIG. 4 will be moved along the intercell signal lines so as to agree with the numerical values in the squares. The procedures shown in FIG. 5 are illustrative only.

Figure 6:
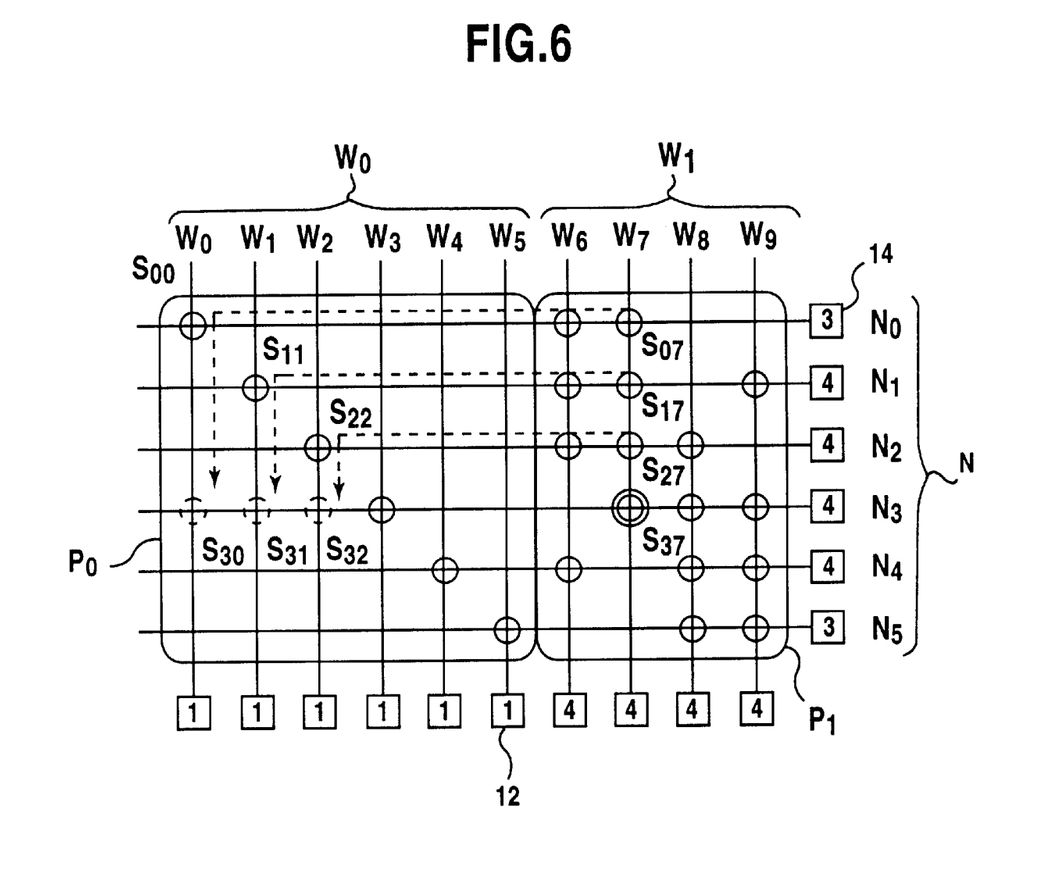
FIG. 6 is a diagram illustrative of the states of planes $P_0$, $P_1$ after the contact switches in the partial plane $P_1$ are relocated.

FIG. 6 illustrates the states of the planes $P_0$, $P_1$ after the contact switches in the partial plane $P_1$ are relocated according to the above movement procedures. Squares 12, 14 added to the intercell signal lines $W_0$~$W_9$ and the input terminals $N_0$~$N_5$ are marked with the respective numbers of program switches associated therewith. In the illustrated states, the input terminals satisfy the condition 3. Then, when the program switches S are moved horizontally along the input terminals N in the overall plane composed of the planes $P_0$, $P_1$, the program switches S are placed in a pattern which satisfies the condition 3 that the numerical values in the squares 14 differ from each other by at most 1.

It is necessary that the program switches S be moved horizontally within a range that will not violate the conditions 1, 2. As indicated by the numerical values in the squares 12 shown in FIG. 6, the movement along the input terminals to satisfy the condition 3 is limited to a movement from the plane $P_1$ to the plane $P_0$ (m>1). Therefore, if the program switches in the plane $P_0$ which satisfy the condition 1 are not moved, then program switches in the plane $P_1$ may be moved to the plane $P_0$ within a range that satisfies the condition 1.

Such movement is based on the important aspect that the input terminals $N_0$, $N_1$ constitute a commutable input group. As described above in the definition 2, a commutable input group means that when values inputted to input terminals $N_3$, $N_2$, for example, which constitute a commutable input group, are interchanged, the output signal from the logic circuit remains unchanged.

Now, horizontal movement of a program switch $S_{37}$ in FIG. 6 will be considered. Since the input terminals $N_3$, $N_2$, for example, are a commutable input pair, attention is directed to another program switch $S_{27}$ connected to the intercell signal line $W_7$ to which the program switch $S_{37}$ is connected. As indicated by a broken line, the program switch $S_{37}$ can be moved as a program switch $S_{32}$ through another program switch $S_{22}$ connected to the input terminal $N_2$ connected to the program switch $S_{27}$ to an interconnection (indicated by a broken line) between the intercell signal line $W_2$ connected to the program switch $S_{22}$ and the input terminal $N_3$.

The intercell signal line $W_7$ is connected through the switch $S_{37}$ to the input terminal $N_3$. The intercell signal line $W_2$ is connected through the switch $S_{22}$ to the input terminal $N_2$ because the intercell signal line $W_7$ is already connected to the input terminal $N_3$. Therefore, the intercell signal lines $W_2$, $W_7$ can be simultaneously connected to the input terminals $N_2$, $N_3$. Even when the program switch $S_{37}$ is moved to the position of the program switch $S_{32}$ the intercell signal line $W_2$ can be connected through the program switch $S_{32}$ to the input terminal $N_3$, and the intercell signal line $W_7$ can be connected through the program switch $S_{27}$ to the input terminal $N_2$. As a result, the intercell signal lines $W_7$, $W_2$ are simply switched around with respect to the input terminals $N_2$, $N_3$, and can still be simultaneously connected to the input terminals. The input terminals $N_2$, $N_3$ are also commutable input terminals.

Similarly, the program switch $S_{37}$ can be moved to the positions of program switches $S_{31}$, $S_{30}$.

A rule for such horizontal movement is summarized as follows:

Rule: It is assumed that $W_i \in W_1$, $S_{wi} = S_v(W_i)$ (program switches in the plane $P_1$). A program switch $S_j$ may be moved to a set of intersections between a set of intercell signal lines:

$$W_v(S_H(W_H(S_{wi}\backslash\{S_j\}))\cap S_0) \qquad (1)$$

and a set of input terminals:

$$W_H(\{S_j\}) \qquad (2)$$

where $S_{wi}\backslash\{S_j\}$ represents a difference set produced when the program switch $S_j$ is removed from the set $S_{wi}$, and $S_H \cap S_0$) represents a product set.

In the example shown in FIG. 6, when $S_j=S_{37}$, the set (1) comprises the intercell signal lines $W_0$, $W_1$, $W_2$, and the set (2) comprises the input terminal $N_3$. Therefore, the program switch $S_{37}$ can be moved to intersections between the intercell signal lines $W_0$, $W_1$, $W_2$ and the input terminal $N_3$.

Figure 7:
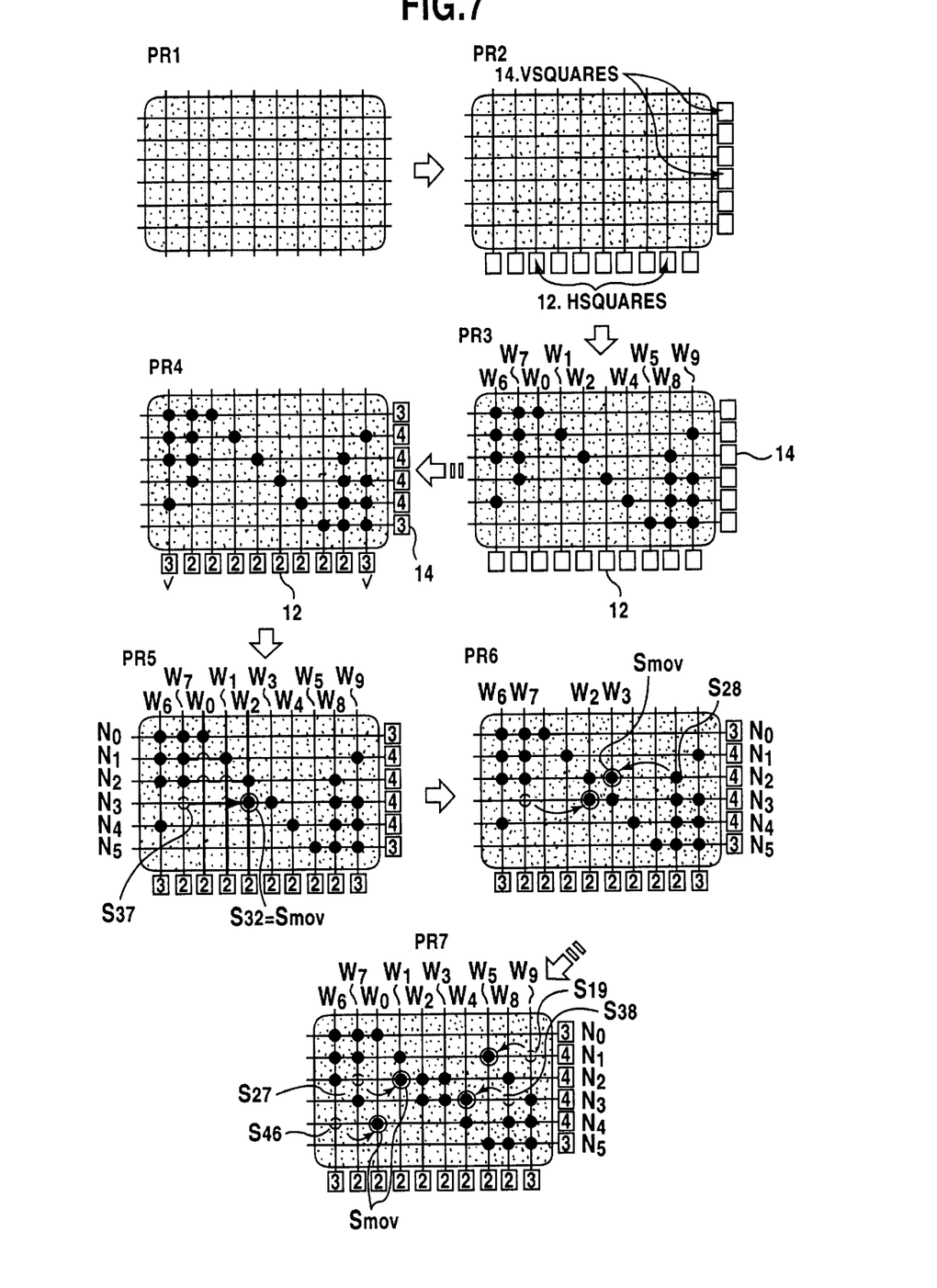
FIG. 7 is a diagram illustrative of a specific process of horizontally moving program switches in a plane.

A specific process of horizontally moving program switches according to the above rule will be described below. FIG. 7 illustrates a specific process of horizontally moving program switches in a plane.

First, a plane P comprising 10 intercell signal lines and 6 input terminals is prepared according to the procedure PR1. Squares 12, 14 are added to ends of the intercell signal lines and the input terminals according to the procedure PR2. Then, the program switches on the two intercell signal lines $W_6$, $W_7$ that are in the left half of the plane $P_1$ shown in FIG. 6 are copied onto the prepared plane P from its left side. Similarly, the program switches on the two intercell signal lines $W_8$, $W_9$ that are in the right half of the plane $P_1$ shown in FIG. 6 are copied onto the prepared plane P from its right side. Then, the program switches in the plane $P_0$ shown in FIG. 6 is copied onto the prepared plane P at its center. The copying of these program switches is effected according to the procedure PR3. The program switches in the plane $P_0$ are divided into left and right areas in order to place the program switches as symmetrically as possible in the prepared plane P. Such division of the program switches in the plane $P_0$ is not a requisite.

According to the procedure PR4, the squares 12, 14 are marked with target numbers of program switches. These target numbers are represented by numerical values produced when the total number of program switches is divided by the number of intercell signal lines and the number of input terminals, with +1 added to each of as many squares as the numerical value of the remainder. Specifically, the squares 12 are marked with 3, 2, 2, - - -, 2, 3, and the squares 14 are marked with 3, 4, 4, 4, 4, 3. These numerical values represent target numbers of program switches.

Then, according to the above rule, the program switches on those intercell signal lines where the numbers of program switches are greater than the target values are horizontally moved.

According to the procedure PR5, a program switch $S_{37}$ is movable to the position of a program switch $S_{32}$, and the program switch $S_{32}$ becomes a program switch $S_{mov}$ after the program switch $S_{37}$ has been moved thereto. As a result, the number of program switches on an intercell signal line $W_2$ reaches the target number of 2. Then, according to the procedure PR6, a program switch $S_{28}$ in symmetric relation to the program switch $S_{37}$ is moved to the position of a program switch $S_{23}=S_{mov}$. As a result, the number of program switches on an intercell signal line $W_3$ also reaches the target number of 2.

Program switches on intercell signal lines $W_6$, $W_7$, $W_8$, $W_9$ where the numbers of program switches are greater than the target values are also moved in the same manner as described above. Specifically, according to the procedure PR7, program switches $S_{46}$, $S_{27}$, $S_{38}$, $S_{19}$ are moved to respective positions of switches $S_{mov}$ marked with double circles. The numbers of program switches connected to all the intercell signal lines and input terminals are now equal to the target numbers thereof.

The numbers and placement of the program switches achieved according to the procedure PR7 are an example which satisfies the conditions 1, 2, 3.

Figure 8:
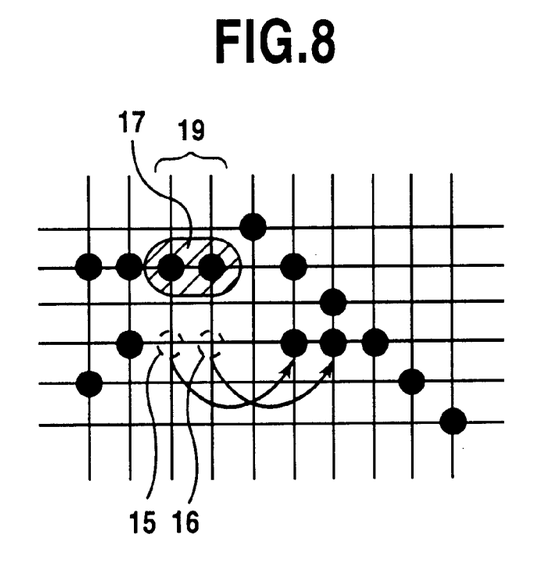
FIG. 8 is a diagram illustrative of an example in which program switches are moved in the direction of input terminals in order to satisfy a condition 3, resulting however in a violation of a condition 2.
Figure 9:
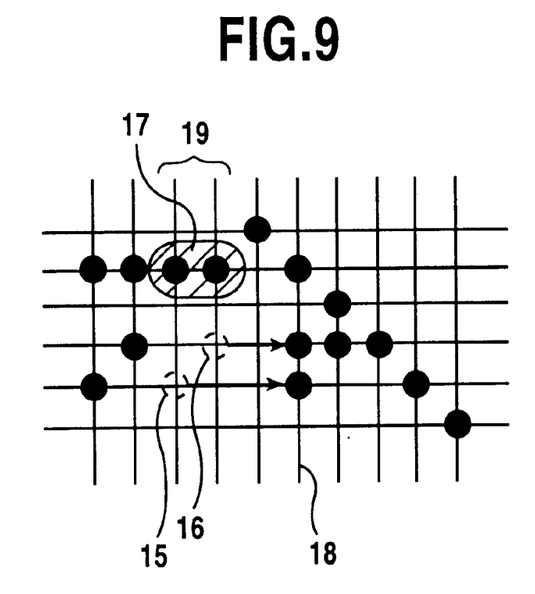
FIG. 9 is a diagram illustrative of another example in which program switches are moved in the direction of input terminals in order to satisfy the condition 3, resulting however in a violation of the condition 2.

FIGS. 8 and 9 illustrate examples in which program switches are moved in the direction of input terminals in order to satisfy the condition 3, resulting however in a violation of the condition 2.

In FIG. 8, program switches 15, 16 indicated by the broken lines are moved to illustrated positions. Before the program switches 15, 16 are moved, two intercell signal lines 19 can be simultaneously connected to two different input terminals. Since the movement of the program switch 16 violates the above rule, the two intercell signal lines 19 cannot be simultaneously connected to two different input terminals after the program switches 15, 16 are moved. That is, the two intercell signal lines 19 conflict with each other at program switches 17.

In FIG. 9, program switches 15, 16 indicated by the broken lines are moved to illustrated positions. Before the program switches 15, 16 are moved, two intercell signal lines 19 can be simultaneously connected to two different input terminals. After the program switches 15, 16 are moved, the two intercell signal lines 19 cannot be simultaneously connected to two different input terminals. In this example, the movement of each of the program switches 15, 16 does not violate the above rule. However, the movement of both the program switches 15, 16 violates the condition 2. The condition 3 is also violated because program switches on an intercell signal line 18 are too many.

Figure 10:
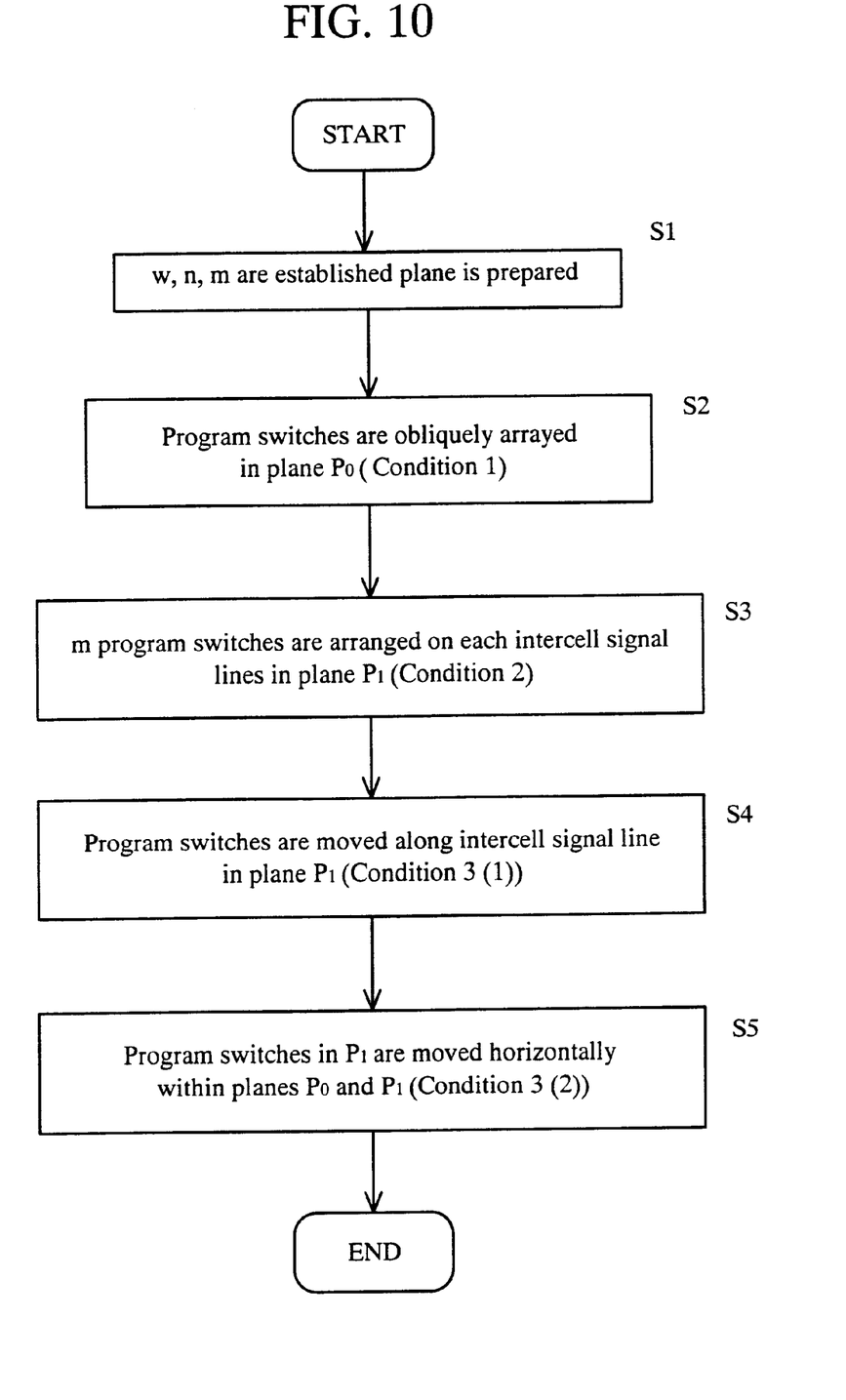
FIG. 10 is a flowchart of a process of placing program switches.

FIG. 10 shows a process of placing program switches. FIGS. 11 through 14 illustrate other processes of placing program switches. The process shown in FIG. 10 will be described below also with reference to FIGS. 11 through 14.

Intercell signal lines W, input terminals N, and m in the condition 2 are established, and a plane comprising w intercell signal lines and n input terminals is prepared in a step S1. In the processes shown in FIGS. 11 through 14, w=12, n=6, and m=3. The numerical value of m is determined depending on the manner in which the resultant FPGA will be used. The numerical value of m is close to the numerical value of n if greater flexibility is desired, and is smaller if the area efficiency of the resultant logic circuit is to be increased though the flexibility may be reduced.

Figure 11:
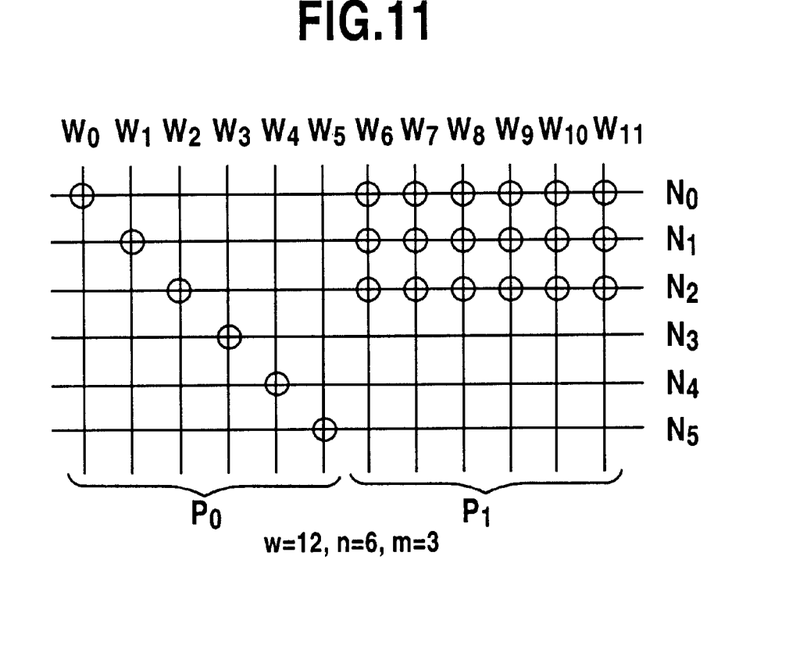
FIG. 11 is a diagram illustrative of another process of placing program switches.

Then, as shown in FIG. 11, program switches are obliquely arrayed in a plane $P_0$. Specifically, one program switch is connected to each of intercell signal lines and to each of input terminals in a step S2. This placement of the program switches satisfies the condition 1.

Then, as shown in FIG. 11, m program switches are placed on intercell signal lines in a remaining plane $P_1$ in a step S3. This placement of the program switches satisfies the condition 2.

Now, any optional m intercell signal lines (m=3) of the 12 intercell signal lines (w=12) can be simultaneously connected to any m input terminals (m=3). To put it otherwise, m input terminals (m=3) can be simultaneously connected to different intercell signal lines.

Figure 12:
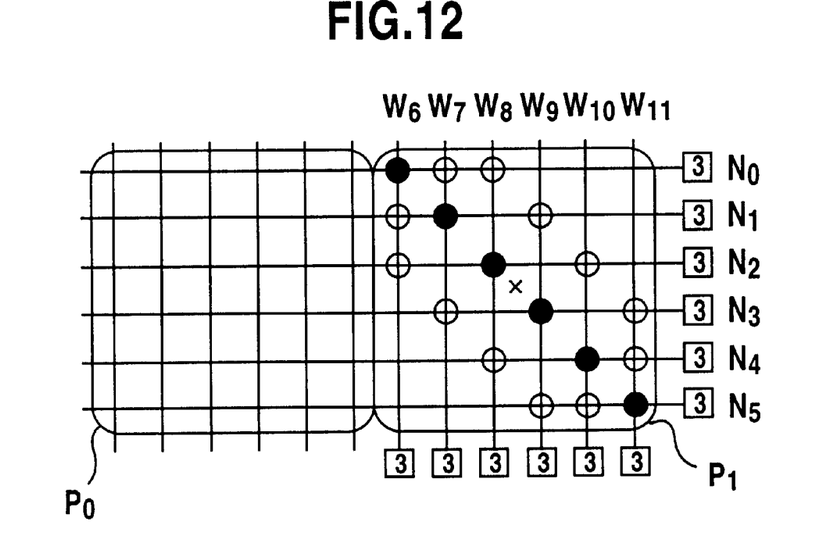
FIG. 12 is a diagram illustrative of still another process of placing program switches.

In a step S4, program switches are moved along intercell signal lines in the plane $P_1$ in order to average the numbers of program switches along the input terminals in order to meet the condition 3. As shown in FIG. 12, program switches marked with black dots are first placed in the plane $P_1$, and program switches marked with white dots are then placed symmetrically with respect to the center of the plane $P_1$. As a result, three program switches are placed along each of the intercell signal lines, and three program switches are placed along each of the input terminals.

Figure 13:
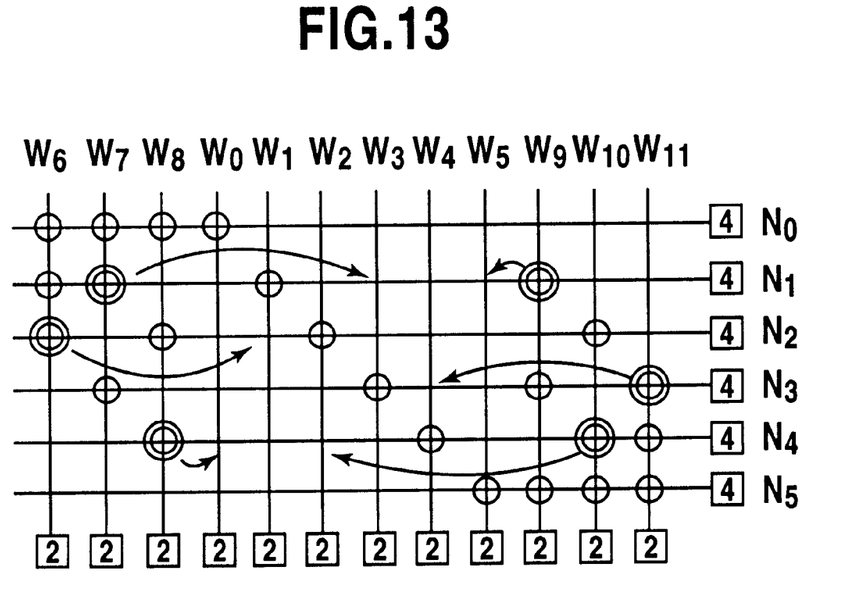
FIG. 13 is a diagram illustrative of yet still another process of placing program switches.

Then, in a step S5, program switches are moved to average the numbers of program switches along the intercell signal lines in order to meet the condition 3. As shown in FIG. 13, the program switches in the right half of the plane $P_1$ are copied onto the overall plane at its right side, and the program switches in the left half of the plane $P_1$ are copied onto the overall plane at its left side. Then, the program switches in the plane $P_0$ are copied onto the overall plane at its center. Those program switches which are marked with double circles in the plane $P_1$ are moved to positions indicated by the arrows in FIG. 13 according to the above rule so as to achieve target values marked in squares at ends of the intercell signal lines and the input terminals. As a consequence, the program switches are moved from the broken-line positions to the positions marked with double circles in FIG. 14, thereby averaging the numbers of program switches on the intercell signal lines.

Figure 14:
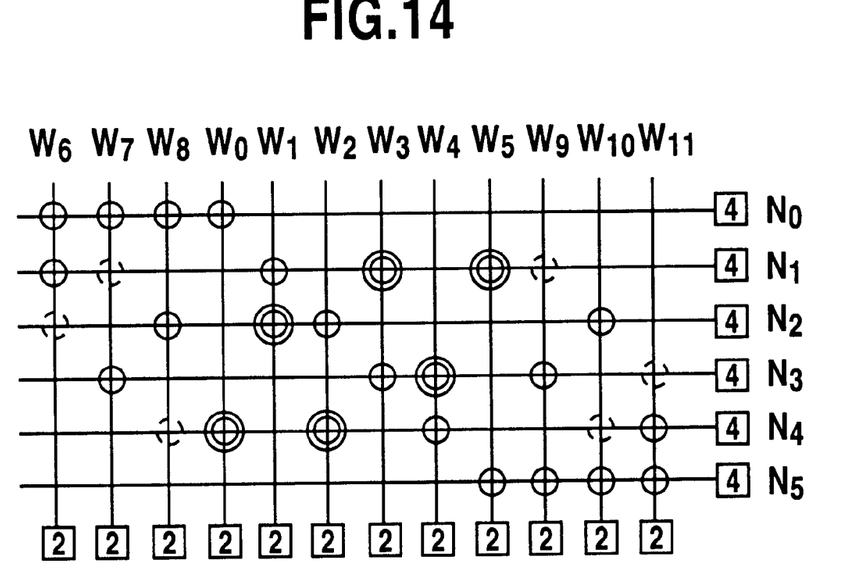
FIG. 14 is a diagram illustrative of a further process of placing program switches.

According the placement of the program switches in the junction shown in FIG. 14, n (=6) intercell signal lines can be connected to input terminals (the condition 1), optional m (=3) intercell signal lines can be connected to any of the input terminals (the condition 2), and the difference between the number of program switches connected to the intercell signal lines and the number of program switches connected to the input terminals is at most 1 (the condition 3).

Figure 15:
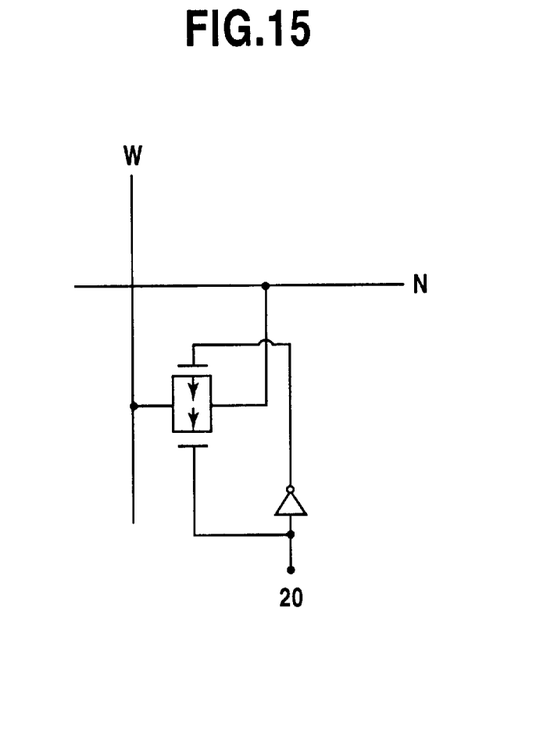
FIG. 15 is a circuit diagram of a program switch.

FIG. 15 shows an example of a program switch. As shown in FIG. 15, the program switch comprises a transfer switch of CMOS connected between an intercell signal line W and an input terminal N. When a programmed status signal is applied, the transfer switch is conducted to connect the intercell signal line W and the input terminal N to each other. The program switch which is rendered selectively conductive and nonconductive is referred to as a passive program switch. Other program switches that are available include a fuse-type program switch which is rendered nonconductive when fused, a PNP-type program switch which is rendered conductive when a junction is broken by the fusion of electrodes, and a passive program switch comprising a capacitor and a resistor.

Figure 16:
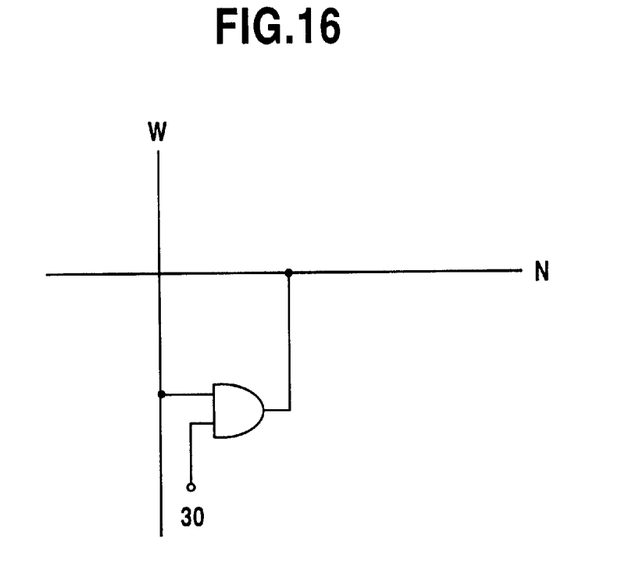
FIG. 16 is a circuit diagram of another program switch.

FIG. 16 shows another example of a program switch. As shown in FIG. 16, the program switch comprises an AND gate having an input terminal connected to an intercell signal line W, an output terminal connected to an input terminal N, and another input terminal for being supplied with a status signal 30. When the status signal 30 is of a high level, high and low levels of the intercell signal line W are transmitted directly to the input terminal N. When the status signal 30 is of a low level, a low level is always applied to the input terminal N regardless of the level of the intercell signal line W. Therefore, the program switch is rendered conductive when the status signal 30 is of a high level.

The gate circuit shown in FIG. 16 can amplify a signal from the intercell signal line W again and transmits the amplified signal to input terminal N. The program switch shown in FIG. 16 is referred to as an active program switch.

With the arrangement of the present invention, as described above, since a minimum number of program switches can be placed in optimum positions, the structure of a junction can be simplified, and the area occupied thereby can be reduced. In a logic circuit having such a junction, e.g., an FPGA or a multimicroprocessor system, the area efficiency (chip area per gate) of the logic circuit can be increased.

With the method of designing a junction according to the present invention, a minimum number of program switches can be placed in optimum positions according to a highly simple process.

Although certain preferred embodiments of the present invention have been shown and described in detail, it should be understood that various changes and modifications may be made therein without departing from the scope of the appended claims.

What is claimed is:

1. An integrated circuit device comprising:
   w, wherein w is greater than or equal to 5, first signal lines;
   n; wherein n is greater than or equal to 3, second signal lines intersecting with said first signal lines, wherein said second signal lines include at least one commutable signal line pair; and
   a junction having programmable switches positioned at intersections between said first signal lines and said second signal lines;
   said switches being placed at positions for connecting n of said first signal lines to at least one combination of said n second signal lines and for connecting optional m, wherein m is greater than or equal to 2 and m is less than n of said first signal lines simultaneously to any m of said second signal lines but not all n second signal lines,
   wherein the total number of switches in said junction is less than w multiplied by n.

2. An integrated circuit device according to claim 1, wherein the number of the switches connected to said first signal lines differ from each other by at most 1.

3. An integrated circuit device according to claim 1 or 2, wherein the number of the switches connected to said second signal lines differ from each other by at most 1.

4. A field programmable gate array comprising:
   a matrix of logic cells each having n input terminals, wherein n is greater than or equal to 3;
   a plurality of intercell buses disposed between said logic cells and each having w, wherein w is greater than or equal to 5, intercell signal lines; and
   junctions disposed around said logic cells and each including said intercell signal lines, n input terminal lines intersecting with said intercell signal lines and connected to said input terminals, and programmable switches disposed at intersections between said intercell signal lines and said input terminal lines;
   said switches being placed at positions for connecting n of said intercell signal lines to at least one combination of said n input terminal lines and for connecting optional m wherein m is greater than or equal to 2 and m is less than n, of said intercell signal lines simultaneously to any m of said input terminal lines but not all n input terminal lines,
   wherein the total number of switches in said junction is less than w multiplied by n, and wherein said input terminals include at least one commutable input terminal pair which allows an output signal from the logic cell to remain unchanged when input signals applied to the commutable input terminal pair are switched around.

5. A field programmable gate array according to claim 4, wherein the number of the switches connected to said intercell signal lines differ from each other by at most 1.

6. A field programmable gate array according to claim 4 or 5, wherein the number of the switches connected to said input terminal lines differ from each other by at most 1.

7. A field programmable gate array according to claims 4 or 5, wherein said input terminals include at least one commutable input terminal pair which allows an output signal from the logic cell to remain unchanged when input signals applied to the commutable input terminal pair are switched around.

8. A field programmable gate array according to any of claims 1 through 5, wherein each of said switches comprises a passive switch which is rendered selectively conductive and nonconductive in response to a status signal applied thereto.

9. A field programmable gate array according to any of claims 1 through 5, wherein each of said switches comprises an active switch for transmitting a signal from an input terminal thereof to an output terminal thereof in response to a status signal applied thereto.

\* \* \* \* \*